US006555397B1

(12) United States Patent
Bonser et al.

(10) Patent No.: US 6,555,397 B1
(45) Date of Patent: Apr. 29, 2003

(54) DRY ISOTROPIC REMOVAL OF INORGANIC ANTI-REFLECTIVE COATING AFTER POLY GATE ETCHING

(75) Inventors: Douglas J. Bonser, Austin, TX (US); Matthew Purdy, Austin, TX (US); James H. Hussey, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 65 days.

(21) Appl. No.: 09/660,723

(22) Filed: Sep. 13, 2000

(51) Int. Cl.[7] ..................... H01L 21/28; H01L 21/3065
(52) U.S. Cl. .......................... 438/9; 438/952; 438/585
(58) Field of Search ................ 438/6, 8, 9, 585–596, 438/738, 952, FOR 127, FOR 101, FOR 193

(56) References Cited

U.S. PATENT DOCUMENTS

| | | | |
|---|---|---|---|
| 5,668,052 A | 9/1997 | Matsumoto et al. | 438/624 |
| 5,883,011 A | 3/1999 | Lin et al. | 438/747 |
| 6,010,829 A * | 1/2000 | Rogers et al. | 430/316 |
| 6,013,570 A | 1/2000 | Yu et al. | 438/595 |
| 6,066,567 A | 5/2000 | En et al. | 438/706 |
| 6,107,172 A | 8/2000 | Yang et al. | 438/585 |
| 6,165,375 A * | 12/2000 | Yang et al. | 216/67 |
| 6,187,644 B1 * | 2/2001 | Lin et al. | 438/197 |
| 6,200,863 B1 * | 3/2001 | Xiang et al. | 438/286 |
| 6,303,477 B1 * | 10/2001 | Ianovitch | 438/551 |
| 6,350,390 B1 * | 2/2002 | Liu et al. | 216/59 |

FOREIGN PATENT DOCUMENTS

| | | | |
|---|---|---|---|
| GB | 2346261 A | 8/2000 | H01L/21/027 |

OTHER PUBLICATIONS

Wolf S. "Silicon Processing for the VLSI–ERA: vol. 1–Process Technology", 1986, Lattice Pr., vol. 1, p. 518, 51, 564–565.*

U.S. Patent application ser. No. 09/660,724 Bonser et al. filed Sep. 13, 2000.

* cited by examiner

Primary Examiner—George Fourson
Assistant Examiner—Suk-San Foong
(74) Attorney, Agent, or Firm—Timothy M. Honeycutt

(57) ABSTRACT

Various methods of fabricating a conductor structure are provided. In one aspect, a method of fabricating a conductor structure on a first workpiece is provided. A silicon film is formed on the first workpiece. An anti-reflective coating is formed on the silicon film. A mask is formed on a first portion of the anti-reflective coating, while a second portion thereof is left unmasked. The second portion of the anti-reflective coating and the silicon film are etched. The mask is removed, and the anti-reflective coating is removed by isotropic plasma etching. Use of isotropic etching for anti-reflective coating removal eliminates thermal shock associated with heated acid bath anti-reflective coating removal.

12 Claims, 3 Drawing Sheets

DRY ISOTROPIC REMOVAL OF INORGANIC ANTI-REFLECTIVE COATING AFTER POLY GATE ETCHING

BACKGROUND OF THE INVENTION

1. Field of the Invention

This invention relates generally to semiconductor processing, and more particularly to methods of removing anti-reflective coating films from circuit structures.

2. Description of the Related Art

Insulated gate field effect transistors ("IGFET"), such as metal oxide semiconductor MO field effect transistors ("MOSFET"), are some of the most commonly used electronic components in modem integrated circuits. Embedded controllers, microprocessors, analog-to-digital converters, and many other types of devices now routinely include millions of field effect transistors. The dramatic proliferation of field effect transistors in integrated circuit design can be traced to their high switching speeds, potentially low power dissipation, and is adaptability to semiconductor process scaling.

A typical field effect transistor implemented in silicon consists of a source and a drain formed in a silicon substrate, and separated laterally to define a channel region in the substrate. A gate electrode composed of a conducting material, such as aluminum or doped polysilicon, is disposed over the channel region and designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. In some conventional processes, the first implant is performed self-aligned to the gate electrode to establish lightly doped drain ("LDD") structures. In others, a pair of very thin dielectric sidewall spacers are formed adjacent to the gate electrode prior to the LDD implant to provide for a small lateral separation between the gate and the LDD structures. After the LDD implant, dielectric sidewall spacers are formed adjacent to the gate electrode where no set of thin spacers preceded the LDD implant, or adjacent to the previously formed thin LDD spacers. The second of the two source/drain implants is then performed self-aligned to the sidewall spacers. The substrate is then annealed to activate the dopant in the source and the drain. Salicidation steps frequently follow the formation of the source and drain to provide contact points for interconnection with later-applied global and/or local interconnect metallization.

The patterning of the polysilicon gate entails the formation of a photoresist mask on the deposited polysilicon film. A resist film is applied to the polysilicon layer and patterned into the desired shape for the poly gate/line. The resist patterning involves resist exposure followed by a solvent rinse. In the first step, the resist is exposed to light passed through a mask or reticle. The light changes the chemical properties of the resist, rendering the resist either soluble or insoluble in a solvent. The resist is then rinsed in the solvent to remove the soluble portions thereof. The exposure light is diffracted by passage through the reticle. As the diffracted light passes through the resist, some of the light rays are scattered while others strike underlying films and reflect upwards. The reflected light rays interfere with incoming rays and produce an interference pattern composed of a plurality of standing waves. The interference pattern can cause unwanted perturbations in the resist, such as stair-stepping and line width variations. The problem is more acute where the underlying film or films are highly reflective. Oxide and polysilicon represent two examples of such reflective films.

In order to reduce the deleterious effects of standing wave interference and light scattering produced by radiation reflected back from the substrate during photoresist exposure, an anti-reflective coating ("ARC") is commonly formed on the polysilicon layer prior to the polysilicon gate etch. Following ARC deposition, photoresist is applied to the polysilicon layer and patterned, i.e. exposed and developed, to establish the desired pattern for the gate. The ARC and the polysilicon layer are then anisotropically etched to define the gate. The photoresist is stripped and the remaining portion of the ARC covering the gate is removed. If not removed, the ARC may interfere with subsequent silicidation or contact formation.

Silicon oxynitride and silicon nitride are two materials frequently used for ARC films. ARC film removal conventionally involves a two-step acid bath dip process. Initially, the ARC film is subjected to a hot bath of light concentration HF at about 65 to 85° C. Next, a dip in hot phosphoric acid is performed, again at about 65 to 85° C. If the composition of the ARC is not anticipated to include oxide, then the HF dip is sometimes skipped.

A number of disadvantages are associated with conventional ARC removal processing. To begin, the hot baths subject the substrate and the polysilicon lines to one or more thermal shocks. In sub-micron processing, such thermal shocks can lead to crystalline dislocations in the lattice structures of the substrate and the overlying polysilicon lines. Such crystalline defects may lead to line lift-off and device failure during subsequent processing steps. Another disadvantage is variations in the linewidth of the polysilicon lines. The hot acid baths will attack the sidewalls of the polysilicon gates or lines to some degree. If the amount of attack is known and repeatable, then the design rules may account for the loss. However, consistency in sidewall attack has proved difficult to attain. The difficulty stems from the fact that the acid solutions can be quickly depleted of reactants. Thus, successive lots of substrates may be subjected to acid baths with different compositions.

The present invention is directed to overcoming or reducing the effects of one or more of the foregoing disadvantages.

SUMMARY OF THE INVENTION

In accordance with one aspect of the present invention, a method of fabricating a conductor structure on a first workpiece is provided. A silicon film is formed on the first workpiece. An anti-reflective coating is formed on the silicon film. A mask is formed on a first portion of the anti-reflective coating, while a second portion thereof is left unmasked. The second portion of the anti-reflective coating and the silicon structure are etched. The mask is removed, and the anti-reflective coating is removed by isotropic plasma etching.

In accordance with another aspect of the present invention, a method of fabricating a conductor structure on a first workpiece is provided. A polysilicon film is formed on the first workpiece and an anti-reflective coating is formed on the polysilicon film. A mask is formed on a first portion of the anti-reflective coating while a second portion thereof is left unmasked. The second portion of the anti-reflective coating and the polysilicon film are etched. The mask and the anti-reflective coating are removed by isotropic plasma etching.

In accordance with another aspect of the present invention, a method of fabricating a conductor structure on a first workpiece is provided. A polysilicon film is formed on the first workpiece and a silicon oxynitride anti-reflective coating is formed on the polysilicon film. A photoresist mask is formed on a first portion of the silicon oxynitride anti-reflective coating while a second portion thereof is left unmasked. The second portion of the silicon oxynitride anti-reflective coating and the polysilicon film are etched. The photoresist mask is removed, and the silicon oxynitride anti-reflective coating is removed by isotropic plasma etching. A width of the polysilicon film is measured and compared with a predicted width and the isotropic etch for a second workpiece is adapted to reduce differences between the measured width and the predicted width.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
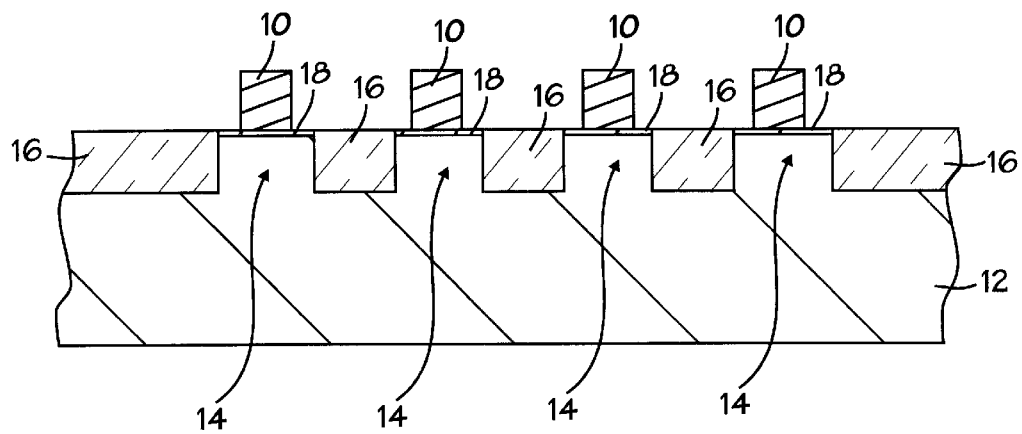
FIG. 1 is a cross-sectional view of an exemplary embodiment of a plurality of conductor or silicon gate structures fabricated on a semiconductor substrate in accordance with the present invention.

In the drawings described below, reference numerals are generally repeated where identical elements appear in more than one figure. FIG. 1 depicts a cross-sectional view of an exemplary embodiment of a plurality of conductor or silicon gate structures 10 fabricated on a semiconductor substrate 12. The gate structures 10 are positioned on active regions 14 that are generally defined and laterally separated by a plurality of isolation structures 16. The conductor structures 10 may be gate electrodes, conductor lines or other circuit structures fabricated from silicon in semiconductor processing. In the embodiment illustrated, the conductor structures 10 are positioned on a respective plurality of gate dielectric layers 18. The substrate 12 may be composed of n-type silicon, p-type silicon, silicon-on-insulator or other suitable substrate materials. The isolation structures 16 may be fabricated from oxide, TEOS, or other commonly used isolation structure materials. The gate dielectric layers 18 may be fabricated from oxide, silicon nitride, laminates of these or other commonly used gate dielectric materials. The conductor structures 10 may be composed of amorphous silicon, polycrystalline silicon or the like.

Figure 2:
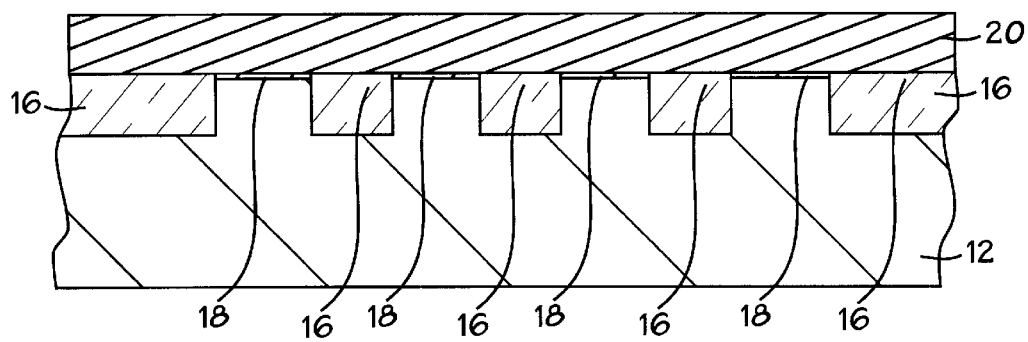
FIG. 2 is a cross-sectional view like FIG. 1 depicting formation of a silicon film on the substrate in accordance with the present invention.

An exemplary process for fabricating one or more of the conductor structures 10 in accordance with the present invention may be understood by referring now to FIGS. 2–9 and initially to FIG. 2. Initially, the isolation structures 16 and the gate dielectric layers 18 may be fabricated on the substrate 12 using a variety of well known techniques. Thereafter, a blanket film 20 of silicon is deposited on the substrate 12. The silicon film 20 may be amorphous silicon or polycrystalline silicon and may be deposited by well known CVD techniques to a thickness of about 800 to 2000 Å. The exact thickness is largely a matter of design discretion.

Figure 3:
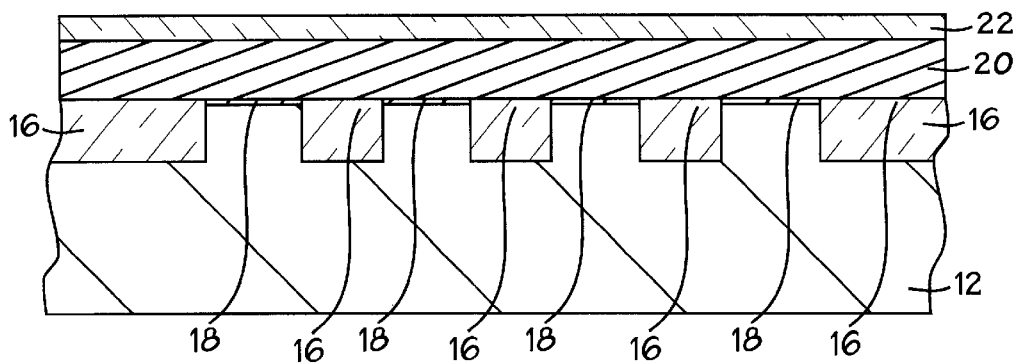
FIG. 3 is a cross-sectional view like FIG. 2 depicting formation of an anti-reflective coating on the silicon film in accordance with the present invention.

Referring now to FIG. 3, an anti-reflective coating 22 is formed on the silicon layer 20 to facilitate later lithographic patterning. The anti-reflective coating 22 may be composed of silicon oxynitride, silicon nitride or the like. In an exemplary embodiment, the ARC 22 is composed of silicon oxynitride and may be deposited using well known CVD techniques to a thickness of about 400 to 1500 Å. Again, this thickness range is largely a matter of design discretion.

Figure 4:
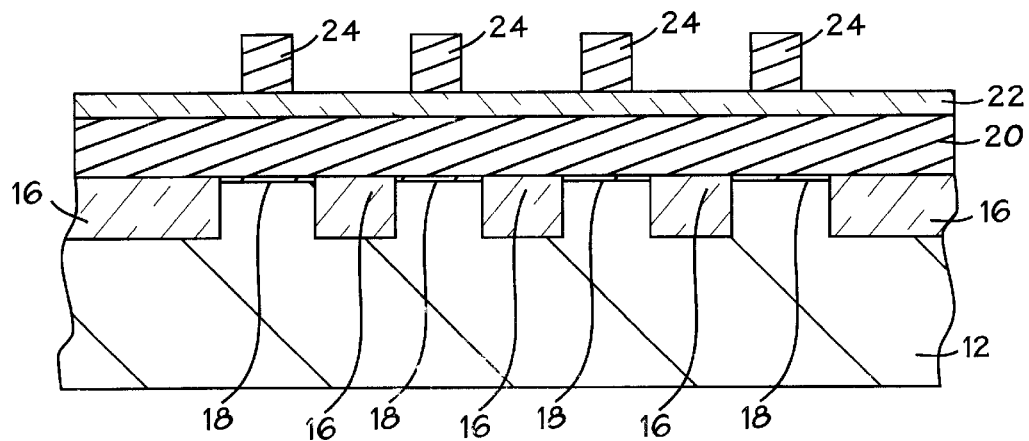
FIG. 4 is a cross-sectional view like FIG. 3 depicting masking of the anti-reflective coating in accordance with the present invention.

Referring now to FIG. 4, a plurality of mask structures 24 are formed on the ARC 22 using well known photoresist materials and lithographic patterning techniques. The width of the mask structures 24 will normally correspond to the critical dimension of the prevailing process technology. However, the mask structures 24 need not have minimum device geometry. The mask structures 24 will serve as an etch mask during a later etch definition process. Note that the ARC 22 is provided in order to facilitate the optics of the exposure required to form the mask structures 24.

Figure 5:
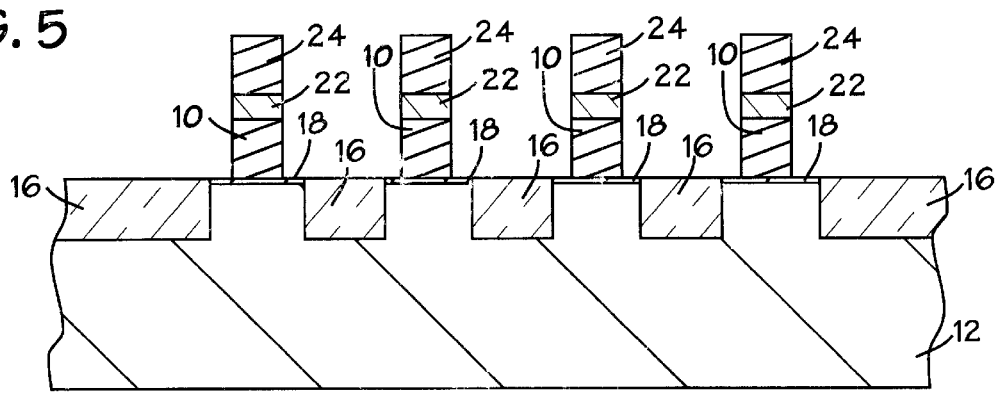
FIG. 5 is a cross-sectional view like FIG. 4 depicting etch definition of the conductor structures in accordance with the present invention.

Referring now to FIG. 5, an anisotropic etch of the ARC 22 and the silicon film 20 is performed to pattern the conductor structures 10 as shown. The portions positioned beneath the mask structures 24 remain after the etch while the unexposed portions are etched away. The anisotropic etch to define the conductor structures 10 may be performed using well known anisotropic etching techniques, such as, for example, reactive ion etching, chemical plasma etching or the like. A variety of chemistries suitable to etch amorphous or polysilicon may be used, such as, for example, $CF_4$, or $CHF_3$, either alone or in combination. End-point for the etch may be determined by timing.

Figure 6:
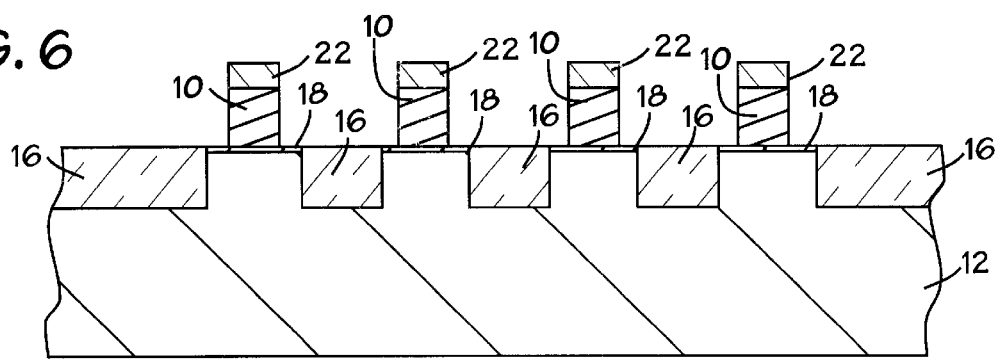
FIG. 6 is a cross-sectional view like FIG. 5 depicting removal of the mask structures from the remaining anti-reflective coating structures in accordance with the present invention.

Referring now to FIG. 6, the resist structures 24 depicted in FIG. 5 are stripped by ashing followed by an RCA-type solvent cleaning process. The stripping process leaves the ARC structures 22 exposed.

Figure 7:
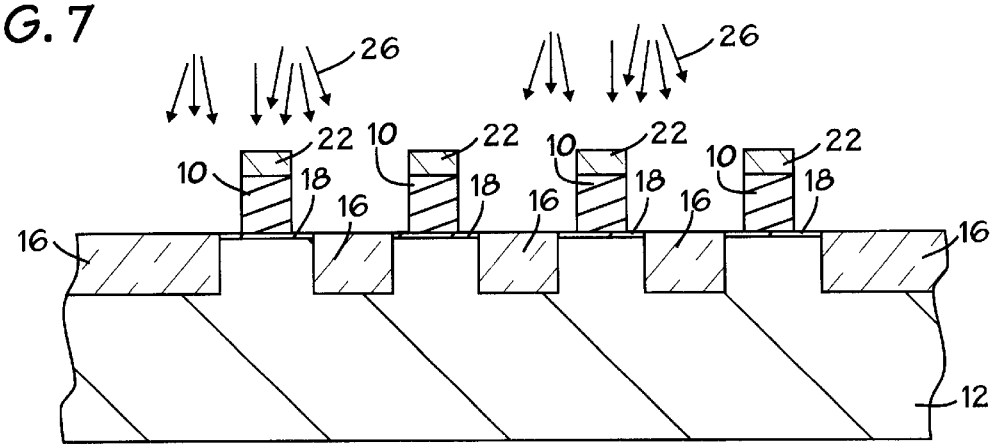
FIG. 7 is a cross-sectional view like FIG. 6 depicting isotropic plasma etch removal of the anti-reflective coating structures in accordance with the present invention.

Referring now to FIG. 7, the ARC structures 22 are removed by an isotropic plasma etch process performed in an etch chamber (not shown). The use of an isotropic plasma etch process to remove the ARC structures 22 supplants the conventional technique of stripping silicon oxynitride-based ARC structures that involves a dip in a heated HF bath followed by a dip in a hot phosphoric acid bath. The goal is to eliminate the thermal shocks associated with the two heated acid bath dips so that thermal shock as a possible mechanism for damage to the crystalline structure of the conductor structures 10 is eliminated. A variety of etch chemistries suitable for isotropically etching silicon oxynitride or silicon nitride may be used. Selectivity to oxide is desirable. In an exemplary embodiment, a fluoro etch chemistry schematically represented by the arrows 26, such as, for example, $CF_4$, $CF4/O_2$, $CHF_3$, $NF_3$ combinations of these or the like may be used alone or in combination in an Applied Materials RPS tool. For example, the etch mixture may include about 40 sccm of $CF_4$. An inert carrier gas such as $N_2$ or argon may be introduced into the chamber as desired. The pressure for the isotropic plasma etch may be about 700 mtorr. The chamber temperature may be about 80° C. and the plasma power may be about 1250 watts. If it is anticipated that a native oxide film will be present on the upper surrams or the ARC structures 22, an initial oxide breakthrough etch flay be performed using about 20 sccm $SF_6$ or $NF_3$ for example.

Note that the ARC isotropic etching process may be used as a means for modifying the width of the conductor structures 10 as desired. For example, if it is desired to decrease the lateral dimensions of the conductor structures 10, the isotropic etch plasma process to strip the ARC structures 22 may be tailored to attack the sidewalls of the conductor structures 10. This may be accomplished by, for example, increasing the available fluorine in the etch chemistry and/or by decreasing the pressure in the chamber.

Figure 8:
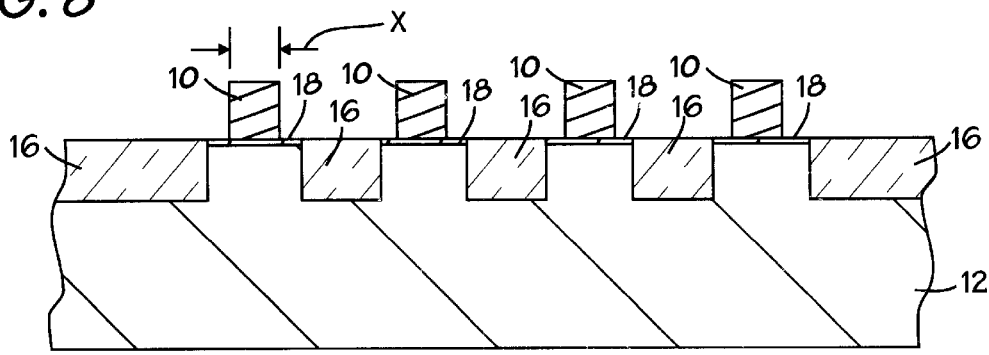
FIG. 8 is a cross-sectional view like FIG. 7 depicting width measurement of the defined conductor structures in accordance with the present invention.

Refer now to FIG. 8, the lateral dimensions X of the conductor structures 10 may be measured following the ARC isotropic plasma etching process. If the measured dimensions X match a predicted width or process target, then no modification to the isotropic etching process to remove the ARC structures 22 need be made. If however, the measured lateral dimensions X of the structures 10 do not match design criteria, then modifications may be made to the ARC isotropic plasma etching process in order to decrease or increase sidewall attack of the silicon conductor structures 10 as may be appropriate. Modifications may also be made to the process used to etch of ARC structures 22 and the silicon film 20 based on the width measurements in order to reduce differences between the it measured width and the predicted width for a second workpiece.

Figure 9:
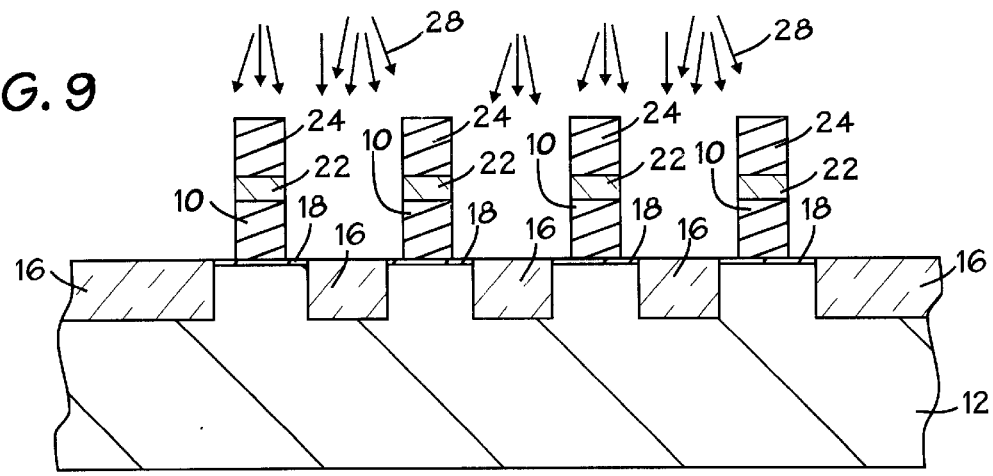
FIG. 9 is a cross-sectional view like FIG. 5 depicting an alternate exemplary embodiment incorporating integrated isotropic etch removal of anti-reflective coating structures and overlying mask structures in accordance with the present invention.

The foregoing illustrative embodiment involves removal of the photoresist structures 24 and the ARC structures 22 in discrete etching processes. However, the removal of the resist structures 24 and the ARC structures 22 may be integrated into a single etching process. The process is illustrated in FIG. 9, which is a cross-sectional view of the substrate 12 similar to FIG. 5. In this illustrative embodiment, an isotropic plasma etch process is performed following the anisotropic etch definition of the conductor structures 10. In an exemplary embodiment, the etch mixture schematically represented by the arrows 28 may contain $CF_4$, $O_2$ and $N_2$. This etch chemistry may be used to strip both the resist structures 24 and the ARC structures 22 using timing for end point detection. In an exemplary embodiment, $CF_4$ is delivered at about 40 sccm, $O_2$ is delivered at about 950 sccm and $N_2$ at about 100 sccm. The pressure may be about 700 mtorr and the chamber temperature about 80° C. Optionally, the foregoing $CF_4$, $O_2$, $N_2$ chemistry may be used for the resist strip and the chemistry changed to the aforementioned $CF_4$, $CHF_3$ chemistry without breaking vacuum for removal of the ARC structures 22. As with the aforementioned illustrative embodiment, a line width measurement may follow the combined photoresist and ARC stripping process and adjustments made to those etching processes as necessary to ensure that the lateral dimensions of the conductor structures 10 match design specifications.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a conductor structure on a first workpiece, comprising:

forming a silicon film on the first workpiece;

forming an anti-reflective coating on the silicon film;

forming a mask on a first portion or the anti-reflective coating, while leaving a second portion unmasked;

etching the second portion of the anti-reflective coating and the silicon film;

removing the mask; and removing the anti-reflective coating by isotropic plasma etching;

measuring a width of the etched silicon film;

comparing the measured width with a predicted width; and adapting the isotropic plasma etch for a second workpiece to reduce differences between the measured width and the predicted width.

2. The method of claim 1, wherein the silicon film comprises polycrystalline silicon.

3. The method of claim 1, wherein the anti-reflective coating comprises silicon oxynitride.

4. The method of claim 1, wherein the etching of the second portion of the anti-reflective coating and the silicon film is by anisotropic plasma etching.

5. The method of claim 1, wherein the isotropic plasma etching is performed with a fluoro species.

6. A method of fabricating a conductor structure on a first workpiece, comprising:

forming a polysilicon film on the first workpiece;

forming an anti-reflective coating on the polysilicon film;

forming a photoresist mask on a first portion of the anti-reflective coating, while leaving a second portion unmasked;

etching the second portion of the anti-reflective coating and the polysilicon film; and removing the photoresist mask and the anti-reflective coating by isotropic plasma etching;

measuring a width of the etched polysilicon film;

comparing the measured width with a predicted width; and adapting the isotropic plasma etch for a second workpiece to reduce differences between the measured width and the predicted width.

7. The method of claim 6, wherein the anti-reflective coating comprises silicon oxynitride.

8. The method of claim 6, wherein the etching of the second portion of the anti-reflective coating and the polysilicon film is by anisotropic plasma etching.

9. The method of claim 6, wherein the isotropic plasma etching is performed with a fluoro species.

10. A method of fabricating a conductor structure on a first workpiece, comprising:

forming a polysilicon film on the first workpiece;

forming a silicon oxynitride anti-reflective coating on the polysilicon film;

forming a photoresist mask on a first portion of the silicon oxynitride anti-reflective coating, while leaving a second portion unmasked;

etching the second portion of the silicon oxynitride anti-reflective coating and the polysilicon film;

removing the photoresist mask;

removing the silicon oxynitride anti-reflective coating by isotropic plasma etching; and measuring a width of the etched polysilicon film and comparing the measured width with a predicted width and adapting the isotropic plasma etch for a second workpiece to reduce differences between the measured width and the predicted width.

11. The method of claim 10, wherein the etching of the second portion of the anti-reflective coating and the polysilicon film is by anisotropic plasma etching.

12. The method of claim 10, wherein the isotropic plasma etching is performed with a fluoro species.

* * * * *

UNITED STATES PATENT AND TRADEMARK OFFICE
CERTIFICATE OF CORRECTION

PATENT NO.     : 6,555,397 B1
DATED          : July 18, 2003
INVENTOR(S)    : Douglas J. Bonser et al.

It is certified that error appears in the above-identified patent and that said Letters Patent is hereby corrected as shown below:

<u>Column 1,</u>
Line 14, delete "MO";
Line 15, delete "modem" and substitute -- modern -- therefor;

<u>Column 5,</u>
Line 23, delete "surrams or" and substitute -- surfaces of -- therefor;
Line 24, delete "flay" and substitute -- may -- therefor <u>Column 6,</u>
Line 25, delete "or" and substitute -- of -- therefor;
Line 29, delete "and"; and
Line 56, delete "and".

Signed and Sealed this

Fourth Day of November, 2003

JAMES E. ROGAN
*Director of the United States Patent and Trademark Office*